United States Patent
Minegishi et al.

(10) Patent No.: US 9,702,580 B2
(45) Date of Patent: Jul. 11, 2017

(54) AIR CONDITIONING CONTROLLING SYSTEM AND AIR CONDITIONING CONTROLLING METHOD

(71) Applicant: FUJITSU LIMITED, Kawasaki-shi, Kanagawa (JP)

(72) Inventors: Akira Minegishi, Setagaya (JP); Akira Kikuchi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/713,021

(22) Filed: May 15, 2015

(65) Prior Publication Data
US 2016/0021792 A1 Jan. 21, 2016

(30) Foreign Application Priority Data
Jul. 17, 2014 (JP) .................. 2014-147182

(51) Int. Cl.
F24F 11/00 (2006.01)
H05K 7/20 (2006.01)

(52) U.S. Cl.
CPC ........ *F24F 11/006* (2013.01); *H05K 7/20745* (2013.01); *H05K 7/20836* (2013.01); *F24F 2011/0042* (2013.01); *F24F 2011/0047* (2013.01)

(58) Field of Classification Search
CPC ............... F24F 11/006; F24F 11/0012; F24F 2011/0043; F24F 2011/0047; F24F 2011/0061; H05K 7/20745; H05K 7/20836
See application file for complete search history.

(56) References Cited

U.S. PATENT DOCUMENTS

| 2011/0231030 | A1* | 9/2011 | Carter ................ G05D 23/1919 700/300 |
| 2012/0180979 | A1* | 7/2012 | Harrington ........... F28D 1/0246 165/11.1 |
| 2013/0151019 | A1* | 6/2013 | Federspiel ............... F24F 11/00 700/276 |
| 2013/0197895 | A1* | 8/2013 | Wang ...................... G06F 1/206 703/21 |

(Continued)

FOREIGN PATENT DOCUMENTS

| JP | 2010-43817 | 2/2010 |
| JP | 2011-85267 | 4/2011 |
| WO | 2013/145273 | 10/2013 |

*Primary Examiner* — Nathan L Laughlin
(74) *Attorney, Agent, or Firm* — Fujitsu Patent Center

(57) ABSTRACT

An air conditioning controlling system, includes: a sensor configured to measure a first air pressure in a cold aisle in a first space cooled by an air conditioner and a second air pressure in a hot aisle in a second space cooled by the air conditioner; and a control apparatus configured to calculate a first prediction value of a power consumption amount of an information processing apparatus and a second prediction value of a power consumption amount of the air conditioner for each of a plurality of first temperatures at an air capacity of the air conditioner which is based on the first air pressure and the second air pressure, detect, from among the plurality of first temperatures, a temperature at which a total value of the first prediction value and the second prediction value is minimized, and set the detected temperature as a second temperature to the air conditioner.

20 Claims, 10 Drawing Sheets

(56) References Cited

U.S. PATENT DOCUMENTS

| | | | |
|---|---|---|---|
| 2013/0289773 A1* | 10/2013 | Waki | G05F 5/00 |
| | | | 700/276 |
| 2014/0254085 A1* | 9/2014 | Slessman | B31B 43/00 |
| | | | 361/679.31 |
| 2014/0371924 A1 | 12/2014 | Kodama et al. | |
| 2015/0156926 A1* | 6/2015 | Levesque | H05K 7/20745 |
| | | | 361/679.47 |

* cited by examiner

FIG. 5

| AIR CAPACITY SETTING | NUMBER OF INSTALLED SERVERS | OUTDOOR AIR TEMPERATURE | SETTING TEMPERATURE | POWER CONSUMPTION AMOUNT OF AIR CONDITIONER | POWER CONSUMPTION AMOUNT OF SERVERS | TOTAL POWER CONSUMPTION AMOUNT | PRESSURE DIFFERENCE |
|---|---|---|---|---|---|---|---|
| 5000 [m^3/h] | 200 | 23°C | 33°C | 500 | 17000 | 17500 | 8 |
| | | | 30°C | 1000 | 16400 | 17400 | 2 |
| | | | 27°C | 2400 | 16000 | 18400 | 2 |
| | | | 24°C | 2800 | 15600 | 18400 | 6 |
| | | | 21°C | 3500 | 15300 | 18800 | 7 |
| | | | 18°C | 4000 | 15000 | 19000 | 8 |

FIG. 6

| AIR CAPACITY SETTING | NUMBER OF INSTALLED SERVERS | OUTDOOR AIR TEMPERATURE | SETTING TEMPERATURE | PREDICTION POWER CONSUMPTION AMOUNT OF AIR CONDITIONER | PREDICTION POWER CONSUMPTION AMOUNT OF SERVERS | PREDICTION TOTAL POWER CONSUMPTION AMOUNT | PRESSURE DIFFERENCE |
|---|---|---|---|---|---|---|---|
| 6000 [m^3/h] | 200 | 15°C | 33°C | 832 | 19300 | 20134 | 10 |
| | | | 30°C | 940 | 18810 | 19750 | 10 |
| | | | 27°C | 941 | 18700 | 19641 | 8 |
| | | | 24°C | 962 | 18520 | 19482 | 9 |
| | | | 21°C | 1038 | 18400 | 19438 | 7 |
| | | | 18°C | 1084 | 18130 | 19214 | 8 |

AIR CONDITIONING CONTROLLING SYSTEM AND AIR CONDITIONING CONTROLLING METHOD

CROSS-REFERENCE TO RELATED APPLICATION

This application is based upon and claims the benefit of priority from the prior Japanese Patent Application No. 2014-147182 filed on Jul. 17, 2014, the entire contents of which are incorporated herein by reference.

FIELD

The embodiments discussed herein are related to an air conditioning controlling system and an air conditioning controlling method.

BACKGROUND

A data center is facilities for managing a plurality of servers kept in the data center. The data center includes a high-speed communication line, power generation equipment and air conditioning equipment, and intensively manages the plurality of servers. A great number of servers and an air conditioner consume enormous power.

A related technology is disclosed in Japanese Laid-open Patent Publication No. 2011-85267, Japanese Laid-open Patent Publication No. 2010-43817 or International Publication Pamphlet No. WO 2013/145273.

SUMMARY

According to an aspect of the embodiments, an air conditioning controlling system, includes: a sensor configured to measure a first air pressure in a cold aisle in a first space cooled by an air conditioner and a second air pressure in a hot aisle in a second space cooled by the air conditioner; and a control apparatus configured to calculate a first prediction value of a power consumption amount of an information processing apparatus and a second prediction value of a power consumption amount of the air conditioner for each of a plurality of first temperatures at an air capacity of the air conditioner which is based on the first air pressure and the second air pressure, detect, from among the plurality of first temperatures, a temperature at which a total value of the first prediction value and the second prediction value is minimized, and set the detected temperature as a second temperature to the air conditioner.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 depicts an example of management information;
FIG. 6 depicts an example of prediction information.

DESCRIPTION OF EMBODIMENTS

Figure 1:
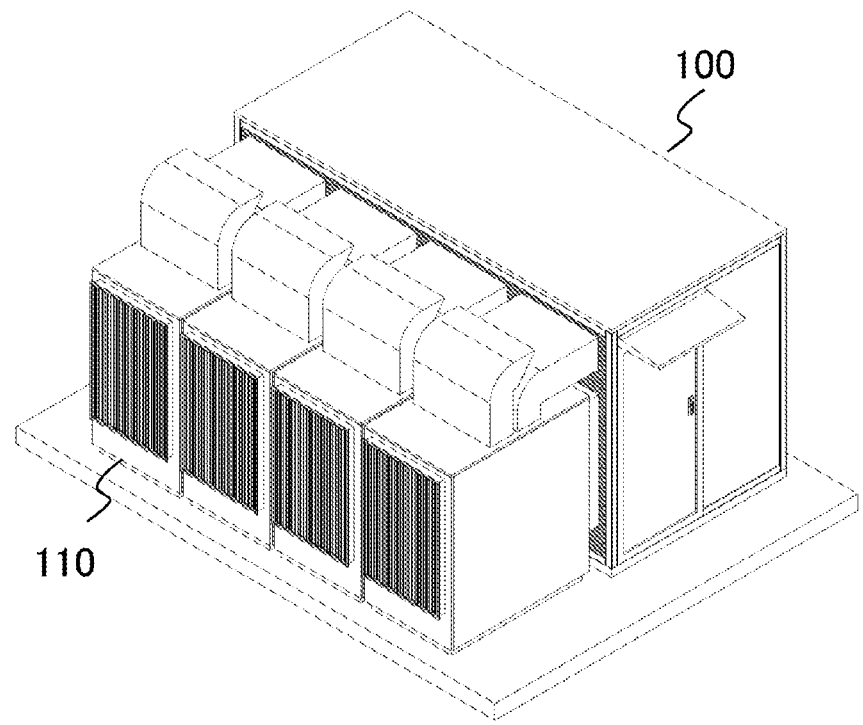
FIG. 1 depicts an example of a container type data center.
Figure 1:
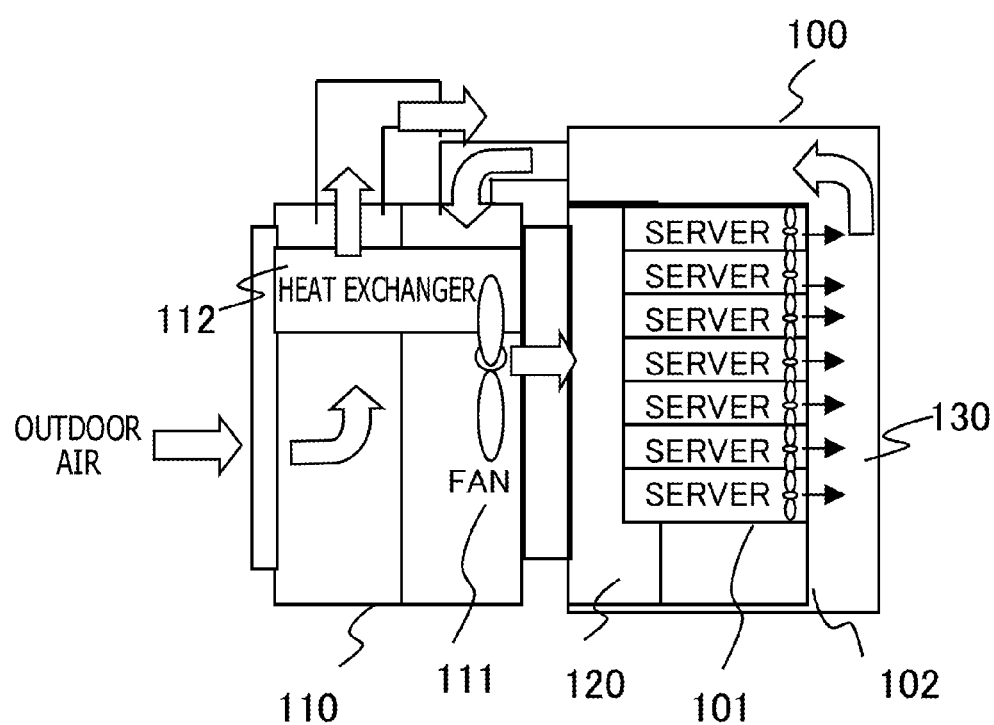

A container type data center that is a data center of reduced-power consumption is provided. FIG. 1 depicts an example of a container type data center. The container type data center depicted in FIG. 1 includes a container 100 and an air conditioner 110. The container 100 includes a server rack 102. In the server rack 102, a plurality of servers 101 are accommodated. The air conditioner 110 is provided on the outside of the container 100 and cools the inside of the data center. A method for cooling the inside of the data center by the air conditioner 110 may include, for example, an indirect outdoor air cooling method that utilizes an outdoor air temperature to cool the air in a room through heat exchange. In the container type data center, the data center is cooled utilizing the outside air to decrease the power consumption amount of the air conditioner.

The container type data center depicted in FIG. 1 adopts the indirect outdoor air cooling method. The air conditioner 110 includes a fan 111 and a heat exchanger 112. In the container type data center in which the indirect outdoor air cooling method is adopted, the fan 111 that is a cooler is provided so as to face the server rack 102. By providing the fan 111 so as to face the server rack 102, the fan 111 directly sends cold air to the servers 101 to cool the servers 101 uniformly. The heat exchanger 112 cools the air in the data center utilizing the outdoor air temperature. The inside of the container 100 is divided into a cold aisle 120 and a hot aisle 130 across the server rack 102. The cold aisle 120 is a space in which cold air sent by the fan 111 gathers and is placed on the fan 111 side across the server rack 102 in the container 100. The hot aisle 130 is a space on the opposite side to the cold aisle 120 across the server rack 102 in the container 100. The hot aisle 130 is a space in which exhausted heat of the servers 101 gathers. The air having flowed into the hot aisle 130 is sent to the heat exchanger 112 of the air conditioner 110 and is cooled utilizing the outdoor air temperature. In this manner, in the container type data center in which the indirect outdoor air cooling method is adopted, cold air sent from the fan 111 cools the servers 101 and exhausted heat of the servers 101 is sent to and cooled by the heat exchanger 112 of the air conditioner 110. At this time, the air in the container type data center may be circulated efficiently.

When the air conditioner is in a controlling mode other than a normal mode, the air capacity may be controlled on the basis of the pressure difference between the cold aisle and the hot aisle, the humidity and the air current. Further, the air capacity from a cool zone to a hot zone may be controlled in a server room so as to be substantially uniform. However, the state of the servers and the air conditioner provided in the data center may not be monitored. A temperature at which the sum total of the power consumption amount of a central processing unit (CPU) corresponding to a temperature variation of the CPU and the power consumption amount of the air conditioner is relatively low may be set to the air conditioner. However, where circulation of the air in the data center is not taken into consideration, an excessive air capacity may appear upon cooling.

The power consumption amount of the data center may be decreased while the air in the data center is circulated efficiently.

Figure 2:
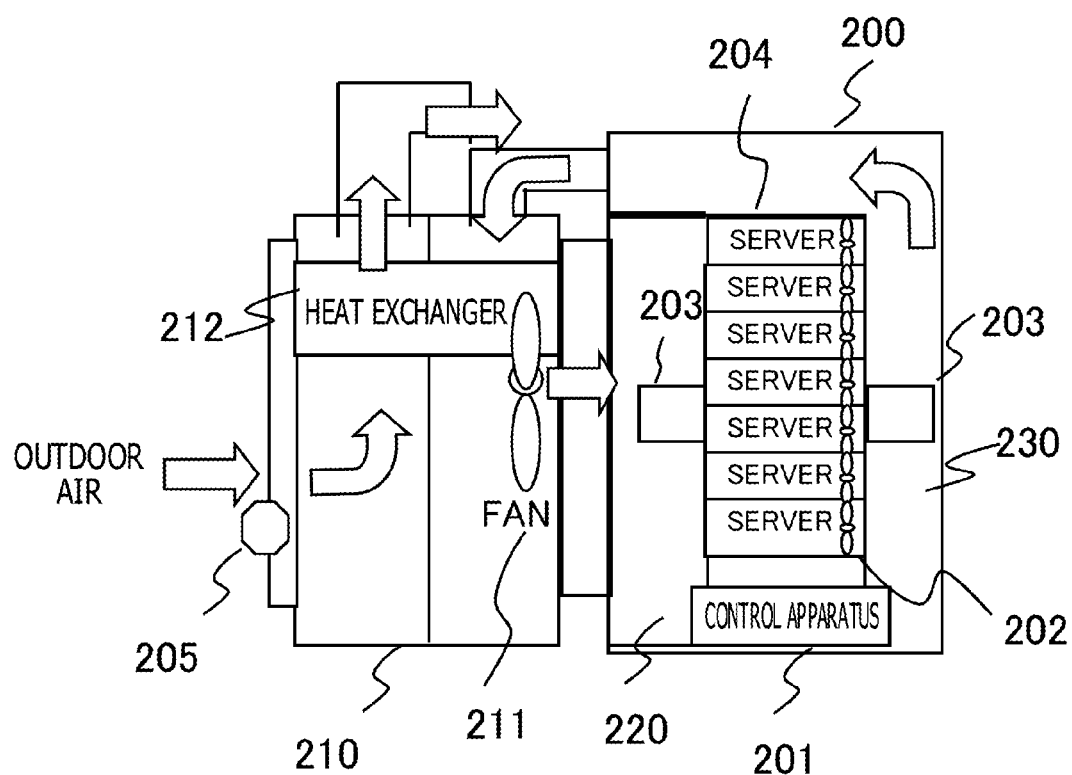
FIG. 2 depicts an example of a container.

FIG. 2 depicts an example of a container. A container type data center depicted in FIG. 2 includes a container 200 and an air conditioner 210. The air conditioner 210 includes a fan 211 and a heat exchanger 212. The air conditioner 210 may be provided on the outside of the container 200 and cools the inside of the data center. The air conditioner 210 adopts the indirect outdoor air cooling method for utilizing the outdoor air temperature to cool the air in the room by the heat exchanger 212 and cools the air in the data center. The fan 211 sends the air cooled by the heat exchanger 212 to the container 200 side. In the container type data center, the data center is cooled utilizing the outdoor air and the outdoor air temperature to decrease the power consumption amount of the air conditioner 210.

The container 200 includes a control apparatus 201, a server rack 202 and a pressure difference sensor 203. The server rack 202 accommodates servers 204. The control apparatus 201 is coupled with various apparatus in the container 200 and the air conditioner 210. For example, the control apparatus 201 is coupled with the servers 204 and acquires power consumption information of the servers 204. The control apparatus 201 is coupled also with the air conditioner 210 and acquires information such as a temperature set to the air conditioner 210, a setting air capacity and a power consumption amount. The setting air capacity may be a value for controlling a rotational speed of the fan 211. The temperature set to the air conditioner 210 may be a value set to the heat exchanger 212. The heat exchanger 212 cools the air in the data center utilizing the outdoor air and the outdoor air temperature so that the temperature of the air in the data center becomes substantially equal to the set temperature. The heat exchanger 212 may include a compressor. The heat exchanger 212 may cool the air using the compressor when the outdoor air temperature is high.

The control apparatus 201 acquires information also from various sensors provided in the container 200. The sensors measure, for example, the temperature inside and outside the container 200, the air pressure inside and outside the container 200 and so forth. The pressure difference sensor 203 measures the pressure difference between the air pressure outside the container 200 and the air pressure at a cold aisle 220 side across the server rack 202. The pressure difference sensor 203 measures the pressure difference between the air pressure outside the container 200 and the air pressure at a hot aisle 230 side across the server rack 202. A temperature sensor 205 may be provided, for example, at a location at which the air conditioner 210 takes in the outdoor air. A different temperature sensor may be provided at both of the hot aisle 230 side and the cold aisle 220 side in the container 200. The control apparatus 201 calculates an average value of values measured by the temperature sensors in the container 200 to measure the state of the temperature in the container 200.

The air conditioner 210 performs a cooling process for the container 200 at a setting temperature which is set. If the temperature in the container 200 reaches the setting temperature set to the air conditioner 210, the control apparatus 201 acquires given information from various apparatus provided in the container 200. For example, the control apparatus 201 acquires air pressure information, as given information, from the pressure difference sensor 203 provided in the container 200. The control apparatus 201 acquires outdoor air temperature information from an air temperature sensor provided in the outside of the container 200. The control apparatus 201 acquires air capacity information set to the air conditioner 210. The control apparatus 201 acquires power consumption amounts consumed by the air conditioner 210 and the servers 204 from the air conditioner 210 and the servers 204. A value calculated by totalizing the power consumption amounts consumed by the air conditioner 210 and the servers 204 may be referred to as total power consumption amount.

The control apparatus 201 decides, from the acquired air pressure information, whether or not the air pressure difference between the hot aisle 230 side and the cold aisle 220 side is equal to or smaller than a given threshold value and besides is a positive value. The air pressure difference is a value obtained by subtracting a value indicating an air pressure on the hot aisle 230 side from a value indicating an air pressure on the cold aisle 220 side. The given threshold value may be, for example, ten pascal (Pa). When the air pressure difference between the hot aisle 230 side and the cold aisle 220 side is equal to or smaller than the given threshold value and besides is a positive value (0 to 10 Pa), the control apparatus 201 does not vary the air capacity set to the air conditioner 210. When the air pressure difference between the hot aisle 230 side and the cold aisle 220 side is greater than the given threshold value, for example, when the air pressure difference is higher than 10 Pa, the control apparatus 201 may decide that the air capacity from the cold aisle 220 side to the hot aisle 230 side is excessively great. Since the air capacity from the cold aisle 220 side to the hot aisle 230 side is excessively great, the control apparatus 201 decreases the air capacity set to the air conditioner 210. When the air pressure difference between the hot aisle 230 side and the cold aisle 220 side is equal to or smaller than the given threshold value and besides is a negative value (equal to or lower than 0 Pa), the control apparatus 201 may decide that the air back-flows from the hot aisle 230 side to the cold aisle 220 side. Since the air back-flows from the hot aisle 230 side to the cold aisle 220 side, the control apparatus 201 increases the air capacity set to the air conditioner 210. The control apparatus 201 controls the air capacity set to the air conditioner 210 to control the air pressure difference between the hot aisle 230 side and the cold aisle 220 side so as to become equal to or smaller than the given threshold value and besides become a positive value (0 to 10 Pa). In this manner, the control apparatus 201 may control the flow of the air in the container 200.

The control apparatus 201 may store management information retained in advance. The management information includes environment information such as air capacity information set to the air conditioner 210, an outdoor air temperature outside the container 200 and so forth and information of the total power consumption amount for each setting temperature capable of being set to the air conditioner 210 corresponding to the environment information. The control apparatus 201 adds information in which the latest environment information, the setting air temperature set to the air conditioner 210 and the acquired total power consumption amount are associated with each other, to the management information. Thereafter, the control apparatus 201 detects a setting temperature of the air conditioner 210 at which the total power consumption amount becomes minimized from the management information which coincides in condition with the latest environment information. The control apparatus 201 sets the detected setting temperature to the air conditioner 210.

The management information may not include information that coincides with the latest environment information. The control apparatus 201 predicts the power consumption amount of the servers 204 provided in the container 200 and the power consumption amount of the air conditioner 210 where a temperature that is a candidate to be set to the air conditioner 210 is set to the air conditioner 210 based on the outdoor air temperature. The control apparatus 201 totalizes a prediction value of the power consumption amount of the servers 204 and another prediction value of the power consumption amount of the air conditioner 210 where the temperature that is a candidate to be set to the air conditioner 210 is set to the air conditioner 210, thereby calculating a prediction total power consumption amount. The control apparatus 201 retains the calculated information as prediction information. The control apparatus 201 detects a setting temperature at which the prediction total power consumption amount is minimized from among temperatures that are candidates to be set to the air conditioner 210. The control apparatus 201 sets the detected setting temperature to the air conditioner 210. Further, the control apparatus 201 sets also the air capacity of the air conditioner 210. The air capacity of the air conditioner 210 is set such that the air pressure difference between the hot aisle 230 side and the cold aisle 220 side is equal to or smaller than the given threshold value and besides is a positive value (0 to 10 Pa).

If the setting temperature at which the prediction total power consumption amount is minimized is set to the air conditioner 210, the control apparatus 201 acquires power consumption information of the servers 204 provided in the container 200, power consumption information of the air conditioner 210 and so forth until the temperature in the container 200 becomes substantially equal to the setting temperature. In the meantime, the control apparatus 201 adds information in which the latest environment information, setting temperature set to the air conditioner 210 and acquired total power consumption amount are associated with each other to the management information. Thereafter, the control apparatus 201 detects the setting temperature of the air conditioner 210 at which the total power consumption amount is minimized from the management information which coincides in condition with the latest environment information. The control apparatus 201 sets the detected setting temperature to the air conditioner 210.

Since a process like this is executed by the control apparatus 201, the setting temperature for the air conditioner 210 in the container type data center whose power consumption amount is likely to vary depending upon a variation of the outdoor air temperature may be determined simply. The power consumption amount of the data center may be decreased while the air in the data center is circulated efficiently.

Figure 3:
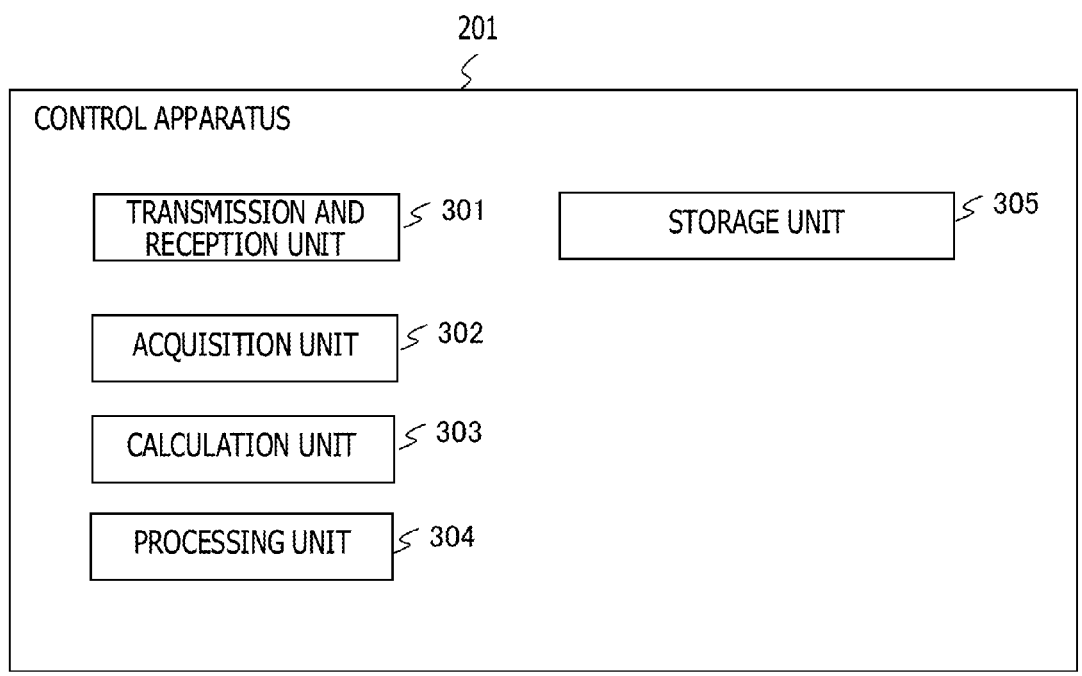
FIG. 3 depicts an example of a functional configuration of a control apparatus.

FIG. 3 depicts an example of a functional configuration of a control apparatus. The control apparatus 201 includes a transmission and reception unit 301, an acquisition unit 302, a calculation unit 303, a processing unit 304 and a storage unit 305. The storage unit 305 may store the management information and the prediction information. The transmission and reception unit 301 may be an interface used when information is acquired from various apparatus in the container 200 and the air conditioner 210. Further, the transmission and reception unit 301 may be an interface used when an instruction for setting of an air capacity or a temperature of the air conditioner 210 is issued. The acquisition unit 302 acquires power consumption information from the servers 204. The acquisition unit 302 acquires power consumption information, air capacity information or setting temperature information from the air conditioner 210. The acquisition unit 302 acquires air pressure information, outdoor air temperature information and so forth from various sensors. The calculation unit 303 totalizes the power consumption amounts consumed by the air conditioner 210 and the servers 204 to calculate the total power consumption amount that is a sum total of the power amounts consumed by the various apparatus in the container 200. The calculation unit 303 calculates an air pressure difference between the hot aisle 230 side and the cold aisle 220 side. The calculation unit 303 calculates a prediction value of the power consumption amount. The processing unit 304 decides whether or not the air pressure difference between the hot aisle 230 side and the cold aisle 220 side is equal to or smaller than a given threshold value and besides is a positive value and sets an air capacity to the air conditioner 210 in response to the air pressure difference. The processing unit 304 performs temperature setting to the air conditioner 210. The processing unit 304 causes the storage unit 305 to store environment information or management information such as the total power consumption amount.

Figure 4:
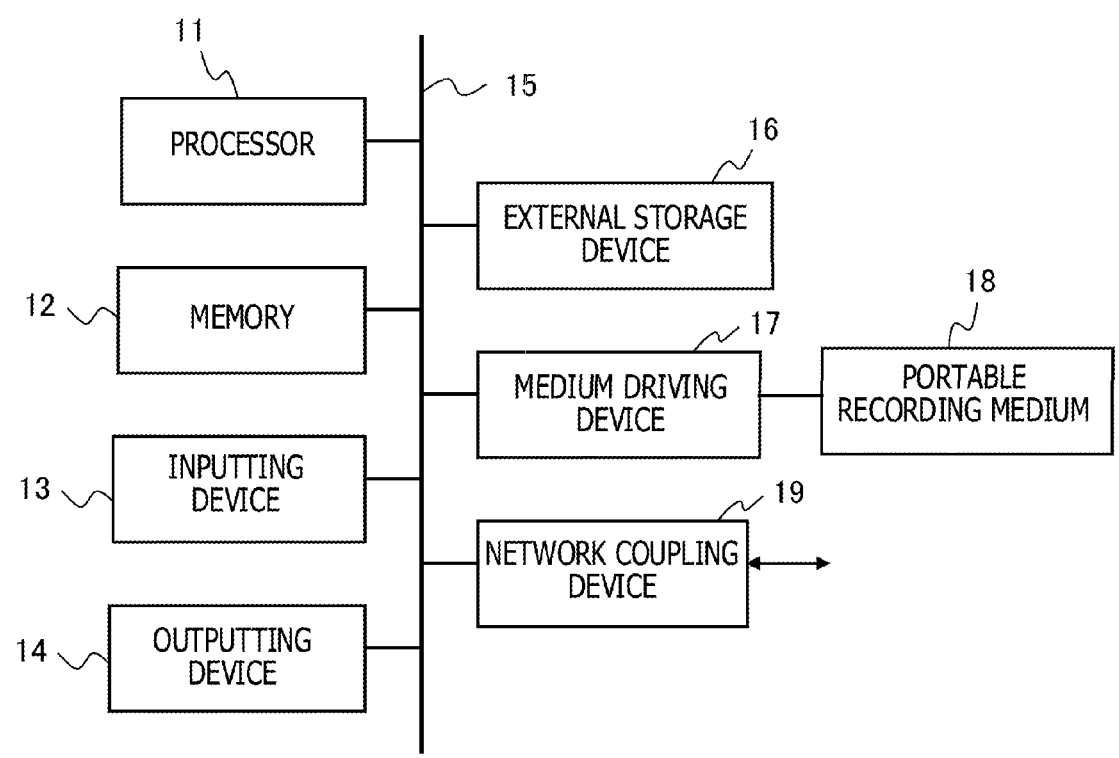
FIG. 4 depicts an example of a hardware configuration of a control apparatus.

FIG. 4 depicts an example of a hardware configuration of a control apparatus. The control apparatus 201 includes a processor 11, a memory 12, a bus 15, an external storage device 16 and a network coupling device 19. As an option, the control apparatus 201 may include an inputting device 13, an outputting device 14 or a medium driving device 17. The control apparatus 201 may be, for example, a computer or the like.

The processor 11 may be an arbitrary processing circuit including a CPU. In the control apparatus 201, the processor 11 may operate as the acquisition unit 302, calculation unit 303 or processing unit 304. The processor 11 may execute a program stored, for example, in the external storage device 16. The memory 12 may operate as the storage unit 305 and retain the management information. The memory 12 may suitably store data obtained by the operation of the processor 11 and data used for processing of the processor 11. The network coupling device 19 may be used for communication with some other apparatus and operate as the transmission and reception unit 301.

The inputting device 13 may include a button, a keyboard, a mouse and so forth. The outputting device 14 may include a display unit or the like. The bus 15 couples the processor 11, memory 12, inputting device 13, outputting device 14, external storage device 16, medium driving device 17 and network coupling device 19 with each other such that transfer of data is performed between the devices mentioned. The external storage device 16 may store a program, data and so forth and provide the stored information suitably to the processor 11 or the like. The medium driving device 17 may output data stored in the memory 12 or the external storage device 16 to a portable recording medium 18 and may read out a program, data and so forth from the portable recording medium 18. The portable recording medium 18 may include a floppy disk, a magneto-optical (MO) disk, a compact disc recordable (CD-R) or a digital versatile disc recordable (DVD-R), and may be an arbitrary portable recording medium.

FIG. 5 depicts an example of management information. The management information may include the air capacity setting information set to the air conditioner 210, the number of installed servers 204 provided in the container 200 or environment information such as an outdoor air temperature outside the container 200 and so forth. The management information may include the power consumption amount of the air conditioner 210, power consumption amount of the servers 204, total power consumption amount or pressure difference information for each setting temperature that is capable of being set to the air conditioner 210 corresponding to the environment information.

The air capacity information set to the air conditioner 210 may be represented, for example, by a unit of m^3/h (per hour). The air capacity set to the air conditioner 210 in FIG. 5 is 5,000 m^3/h. The number of installed servers retained by the management information is the number of servers 204 that are operating from among the number of installed servers 204 provided in the container 200. The outdoor air temperature is temperature information acquired by the control apparatus 201 from a temperature sensor provided in the outside of the container 200.

The setting temperature information capable of being set to the air conditioner 210 may include a temperature capable of being functionally set by the air conditioner 210. The setting temperature capable of being set to the air conditioner 210 may be, for example, 33° C., 30° C., 27° C., 24° C., 21° C. or 18° C. The setting temperature capable of being set to the air conditioner 210 may be set for every 1° C. or 0.1° C. if the temperature can be functionally set by the air conditioner 210. The power consumption amount of the air conditioner 210 and the power consumption amount of the servers 204 are acquired from the air conditioner 210 and the servers 204 by the control apparatus 201. The power consumption amount of the servers 204 is a sum total of the power consumption amounts of the servers 204 that are operating in the container 200. The total power consumption amount is calculated by adding the power consumption amount of the air conditioner 210 and the power consumption amount of the servers 204. The pressure difference is a difference between the air pressure on the cold aisle 220 side and the air pressure on the hot aisle 230 side across the server rack 202. A value obtained by subtracting the air pressure on the cold aisle 220 side from the air pressure on the hot aisle 230 side and acquired as the air pressure information from the pressure difference sensor 203 by the control apparatus 201 is the pressure difference.

When the acquired environment information coincides with the management information depicted in FIG. 5, the control apparatus 201 detects, for example, the setting temperature 30° C. of the air conditioner 210 corresponding to 17,400 W as a setting temperature at which the total power consumption amount is minimized.

FIG. 6 depicts an example of prediction information. When the acquired environment information does not coincide with the management information depicted in FIG. 5, the control apparatus 201 produces prediction information. The prediction information may include, as the environment information, the air capacity setting information set to the air conditioner 210, the number of installed servers 204 provided in the container 200 or outdoor air temperature outside the container 200. The prediction information may include a prediction power consumption amount of the air conditioner 210, a prediction power consumption amount of the servers 204, a prediction total power consumption amount or pressure difference information for each setting temperature capable of being set to the air conditioner 210 corresponding to the environment information.

The environment information of the prediction information of FIG. 6 is latest environment information acquired by the control apparatus 201. The setting temperature capable of being set to the air conditioner 210 may be, for example, 33° C., 30° C., 27° C., 24° C., 21° C. or 18° C. The setting temperature capable of being set to the air conditioner 210 may be set for every 1° C. or 0.1° C. if the temperature can be functionally set by the air conditioner 210. The prediction power consumption amount of the air conditioner 210 and the prediction power consumption amount of the servers 204 are calculated based on the environment information by the control apparatus 201. The prediction total power consumption amount is calculated by adding the prediction power consumption amount of the air conditioner 210 and the prediction power consumption amount of the servers 204. The prediction power consumption amount may be predicted such that the pressure difference is, for example, within a range from 0 to 10 Pa.

The control apparatus 201 detects a setting temperature at which the prediction total power consumption amount is minimized from the produced prediction information. In FIG. 6, the control apparatus 201 may detect the setting temperature 18° C. of the air conditioner 210 corresponding to 19,214 W as a setting temperature at which the total power consumption amount is minimized.

Figure 7:
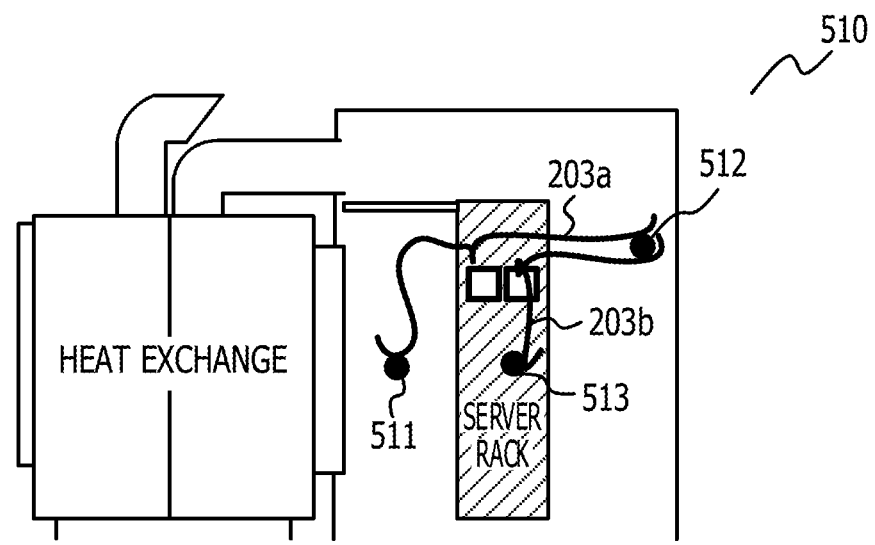
FIG. 7 depicts an example of a pressure difference sensor in a container.
Figure 7:
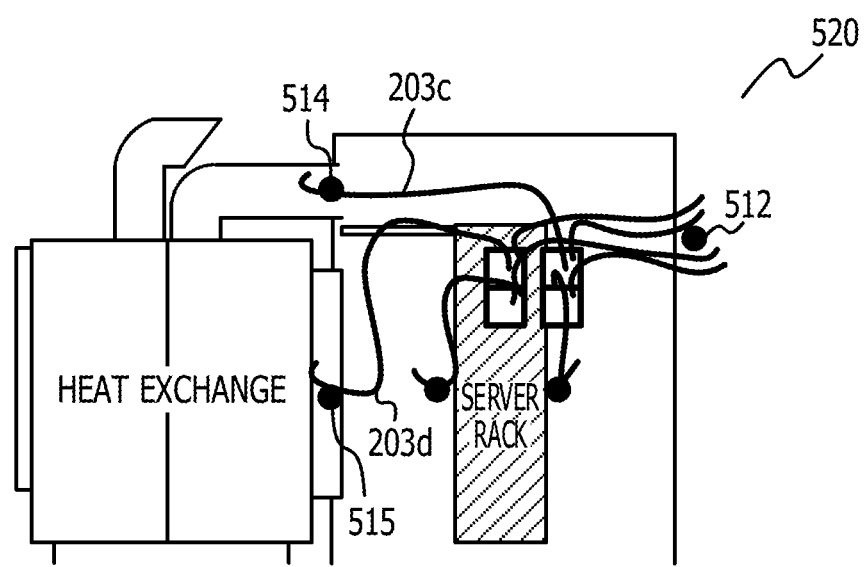

FIG. 7 depicts an example of a pressure difference sensor in a container. In a working example 510 depicted in FIG. 7, a pressure difference sensor 203a and another pressure difference sensor 203b are provided in the container 200. The pressure difference sensor 203a measures an air pressure difference between a point 511 on the cold aisle 220 side and another point 512 in the outside of the container 200 across the server rack 202. The pressure difference sensor 203a may have a shape of a tube. Measurement points of the point 511 and the point 512 may be placed at substantially the same height. The pressure difference sensor 203b measures the air pressure difference between a point 513 on the hot aisle 230 side and the point 512 in the outside of the container 200 across the server rack 202. The pressure difference sensor 203b may have a shape of a tube. Measurement points of the point 512 and the point 513 may be placed at substantially the same height. The control apparatus 201 calculates a pressure difference between the point 511 and the point 513 based on the air pressure difference between the point 511 and the pressure outside the container 200 of the common point 512 and the air pressure difference between the point 513 and the pressure outside the container 200 of the common point 512.

In another working example 520 depicted in FIG. 7, in addition to the configuration of the working example 510, a pressure difference sensor 203c and another pressure difference sensor 203d are provided in the container 200. The pressure difference sensor 203c measures an air pressure difference between a point 514 in the hot aisle 230 and the point 512 outside the container 200. The pressure difference sensor 203c may have a shape of a tube. Measurement points of the point 514 and the point 512 may be placed at substantially the same height. The pressure difference sensor 203d measures an air pressure difference between a point 515 in the cold aisle 220 and the point 512 outside the container 200. The pressure difference sensor 203d may have a shape of a tube, and measurement points of the point 515 and the point 512 may be placed at substantially the same height. The control apparatus 201 calculates a pressure difference between the point 514 and the point 515 based on the air pressure difference between the point 514 and the pressure outside the container 200 of the common point 512 and the air pressure difference between the point 515 and the pressure outside the container 200 of the common point 512.

Figure 8:
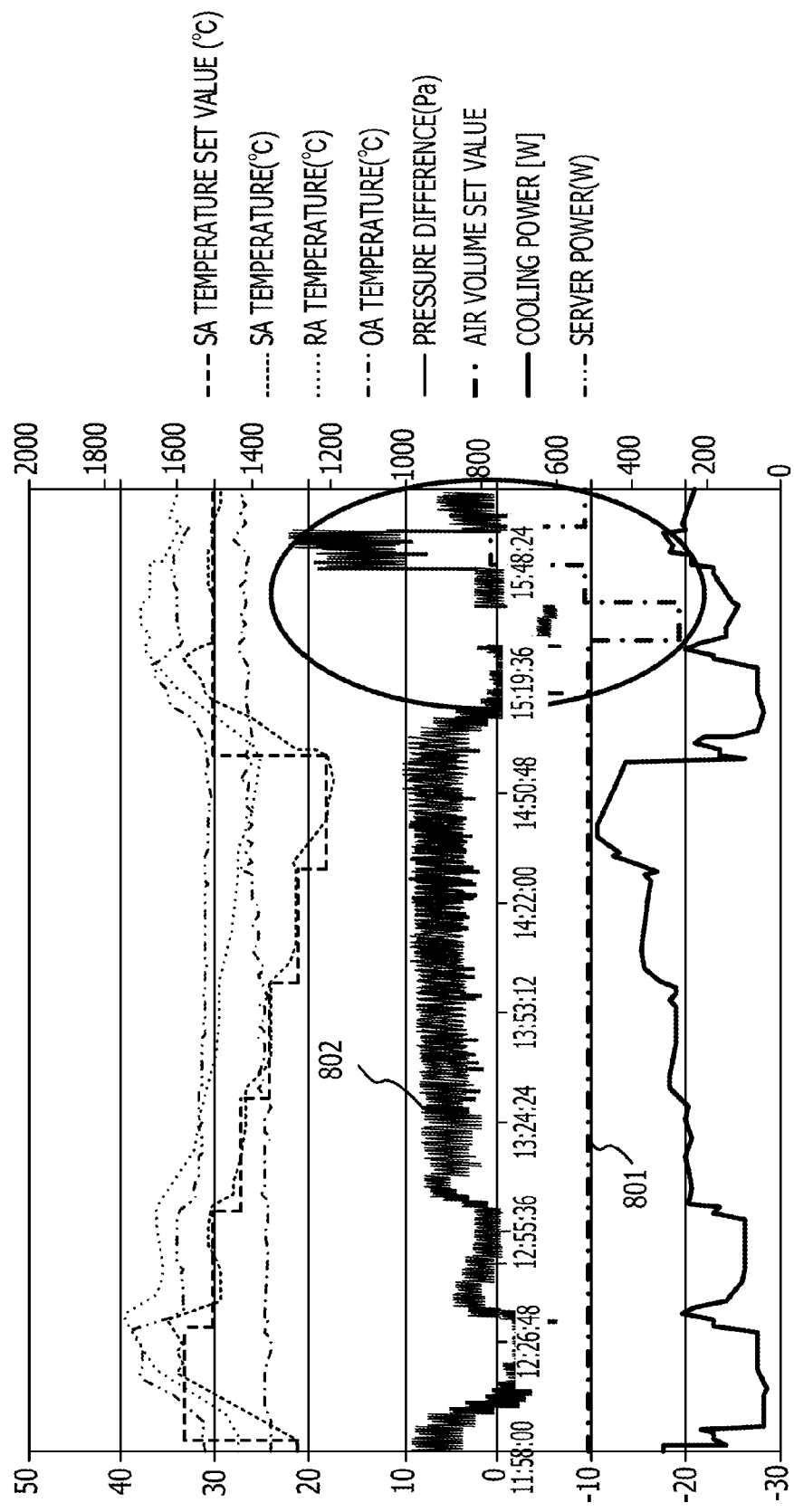
FIG. 8 depicts an example of a relationship between an air capacity and a pressure difference.

FIG. 8 depicts an example of a relationship between an air capacity and a pressure difference. A line 801 indicates an air capacity set to the air conditioner 210. The axis of ordinate for the line 801 represents 0 to 2,000 (m^3/h) on the right side of the graph and the axis of abscissa represents time.

Another line 802 indicates a pressure difference between the hot aisle 230 side and the cold aisle 220 side across the server rack 202. The axis of ordinate for the line 802 represents a pressure of −30 to 50 Pa on the left side of the graph and the axis of abscissa represents time.

The control apparatus 201 controls the pressure difference between the hot aisle 230 side and the cold aisle 220 side across the server rack 202 so as to be equal to or lower than 10 Pa. At a portion surrounded by a circle, the air capacity decreases once on the line 801 and increases thereafter. Also the pressure difference increases or decreases as depicted in the line 802 in accordance with an increase or a decrease of the air capacity of the line 801. By adjusting the air capacity by the control apparatus 201 in this manner, the control apparatus 201 controls the pressure difference between the hot aisle 230 side and the cold aisle 220 side across the server rack 202 so as to be equal to or lower than 10 Pa.

Figure 9:
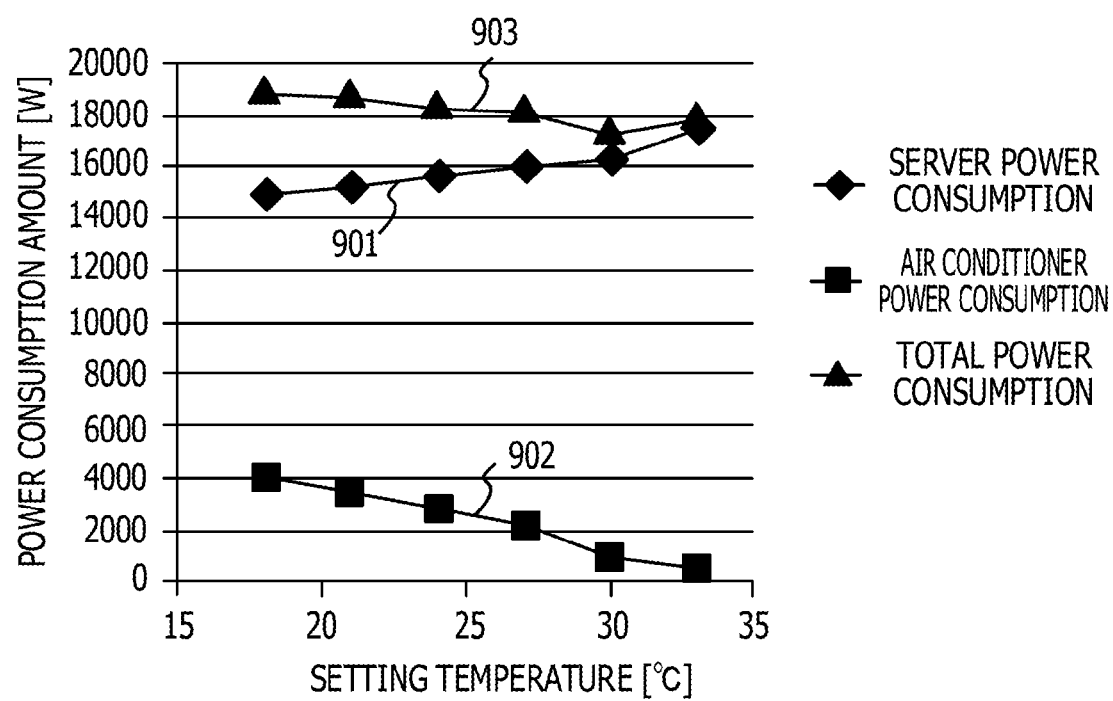
FIG. 9 depicts an example of a power consumption amount.

FIG. 9 depicts an example of a power consumption amount. The axis of ordinate of FIG. 9 indicates a power consumption amount. The axis of abscissa of FIG. 9 indicates a setting temperature set to the air conditioner 210. A line 901 indicates a power consumption amount of the servers 204. The power consumption amount of the servers 204 increases as the setting temperature set to the air conditioner 210 increases. This is because the rotational speed of the cooling air conditioner is increased by the servers 204 themselves to cool the servers 204 themselves as the setting temperature set to the air conditioner 210 increases. A line 902 indicates a power consumption amount of the air conditioner 210. The power consumption amount of the air conditioner 210 decreases as the setting temperature set to the air conditioner 210 increases. Since the temperature in the container 200 approaches an outdoor air temperature and the temperature for cooling the inside of the container 200 by the air conditioner 210 decreases as the setting temperature set to the air conditioner 210 increases, the power consumption amount of the air conditioner 210 decreases. A line 903 indicates a total power consumption amount. The total power consumption amount is calculated by adding the power consumption amount of the servers 204 and the power consumption amount of the air conditioner 210. The control apparatus 201 sets a setting temperature at which the total power consumption amount is minimized to the air conditioner 210. In FIG. 9, the setting temperature at which the total power consumption amount is minimized may be 30° C.

Figure 10:
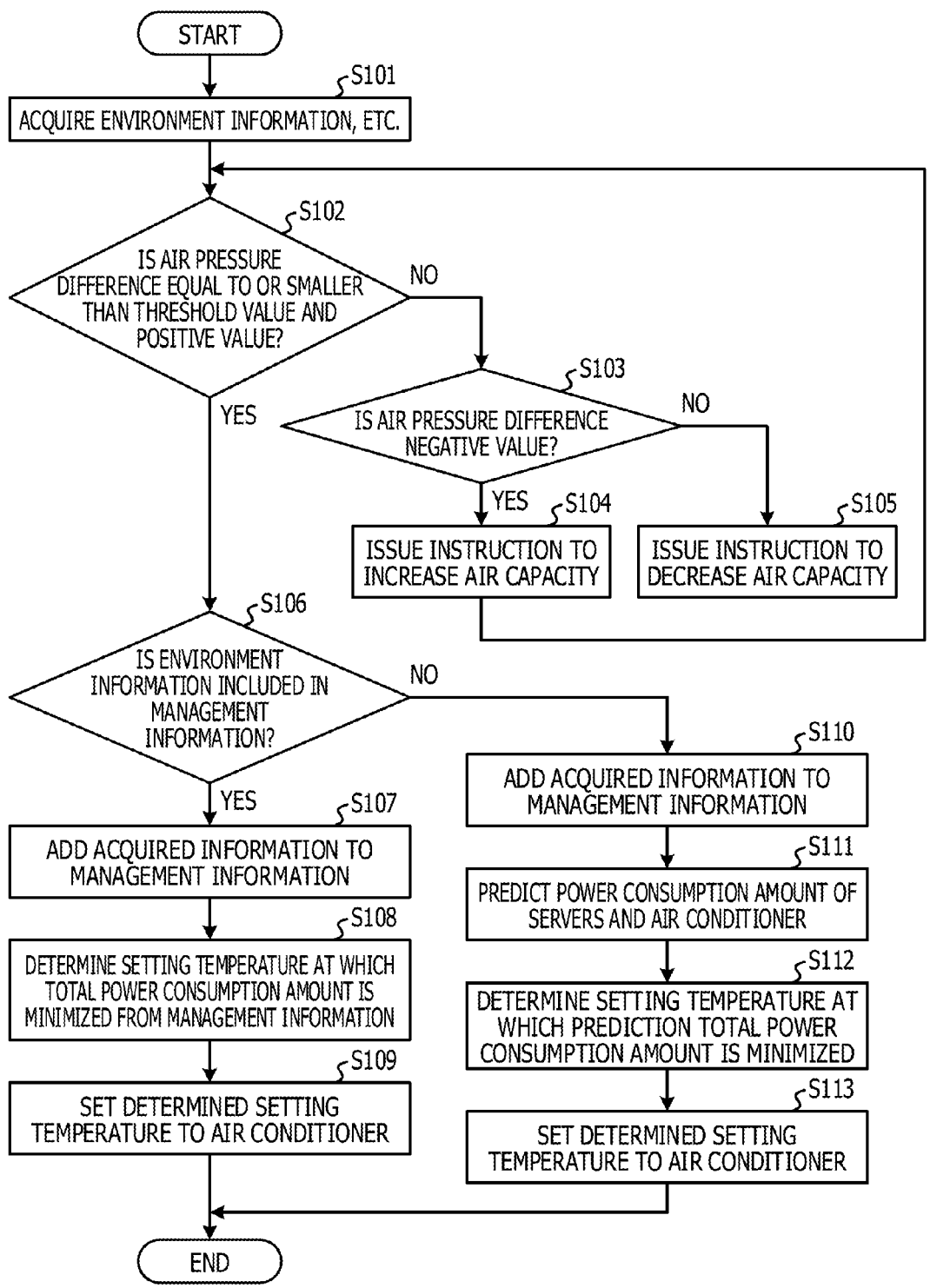
FIG. 10 depicts an example of a process of a control apparatus.

FIG. 10 depicts an example of a process of a control apparatus. The control apparatus 201 acquires an outdoor air temperature, pressure difference information between the hot aisle 230 and the cold aisle 220, power consumption information of the air conditioner 210 and the servers 204 or air capacity information (operation S101). The control apparatus 201 decides whether or not the air pressure difference between the hot aisle 230 side and the cold aisle 220 side is equal to or smaller than the given threshold value and besides is a positive value (operation S102). When the air pressure difference between the hot aisle 230 side and the cold aisle 220 side is not equal to or smaller than the given threshold value or is not a positive value (NO at operation S102), the control apparatus 201 decides whether the air pressure difference is a negative value (equal to or smaller than 0 Pa) (operation S103). When the air pressure difference between the hot aisle 230 side and the cold aisle 220 side is a negative value (equal to or smaller than 0 Pa) (YES at operation S103), the control apparatus 201 increases the air capacity set to the air conditioner 210 (operation S104). When the air pressure difference between the hot aisle 230 side and the cold aisle 220 side is not a negative value (NO at operation S103), the control apparatus 201 decreases the air capacity set to the air conditioner 210 (operation S105). If the processes at operations S104 and S105 end, the processing is repetitively performed from operation S102.

When the air pressure difference between the hot aisle 230 side and the cold aisle 220 side is equal to or smaller than the given threshold value and is a positive value (YES at operation S102), the control apparatus 201 decides whether or not information that coincides with the acquired environment information is included in the management information (operation S106). When the acquired environment information is included in the management information (YES at operation S106), the control apparatus 201 adds the acquired information to the management information (operation S107). The control apparatus 201 detects a setting temperature of the air conditioner 210 at which the total power consumption amount is minimized from the management information coincident with the acquired environment information (operation S108). The control apparatus 201 sets the detected setting temperature to the air conditioner 210 (operation S109).

When the acquired environment information is not included in the management information (NO at operation S106), the control apparatus 201 adds the acquired information to the management information (operation S110). The control apparatus 201 predicts, based on the outdoor air temperature, the power consumption amount of the servers 204 provided in the container 200 and the power consumption amount of the air conditioner 210 in the case in which a temperature which is a candidate to be set to the air conditioner 210 is set to the air conditioner 210 (operation S111). The control apparatus 201 detects a setting temperature at which the prediction total power consumption amount is minimized (operation S112). The control apparatus 201 sets the detected setting temperature to the air conditioner 210 (operation S113). If the process at the operation S109 or S113 ends, the processing ends. The control of the pressure difference at operations S102 to S105 may be performed after operation S109 or operation S113.

Since a process like this is executed by the control apparatus 201, a setting temperature of the air conditioner 210 in the container type data center in which the power consumption amount is likely to vary in accordance with a variation of the outdoor air temperature may be determined simply. The power consumption amount of the data center may be reduced while the air in the data center is circulated efficiently.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An air conditioning controlling system, comprising:
    a sensor including a first sensor provided in a cold aisle in a first space of a container cooled by an air conditioner and a second sensor provided in a hot aisle in a second space of the container cooled by the air conditioner, the first sensor configured to measure a first air pressure difference between a cold point in the cold aisle and an outside point outside the first space and the second space, the second sensor configured to measure a second air pressure difference between a hot point in the hot aisle and the outside point; and a control apparatus configured to:
adjust an air capacity of the air conditioner in such a manner that an air pressure difference between the first air pressure difference and the second air pressure difference falls within a given range when a temperature in the container becomes a temperature setting for the air conditioner;
calculate a first prediction value of a power consumption amount of an information processing apparatus in the container and a second prediction value of a power consumption amount of the air conditioner at the adjusted air capacity of the air conditioner based on a temperature of air outside the first space and the second space;
detect a temperature at which a total value of the first prediction value and the second prediction value is minimized from a storage including a plurality of temperatures to be set in the air conditioner in association with respective total values; and
set the detected temperature as a new temperature setting for the air conditioner.

2. The air conditioning controlling system according to claim 1, wherein the first sensor has a shape of a tube which is coupled to the cold point and the outside point and the second sensor has a shape of a tube which is coupled to the hot point and the outside point.

3. The air conditioning controlling system according to claim 1, wherein, when the detected temperature is set as the temperature setting for the air conditioner, the control apparatus stores the total value in the storage.

4. The air conditioning controlling system according to claim 1, wherein the air conditioner includes a temperature sensor configured to measure the temperature of air outside the first space and the second space.

5. The air conditioning controlling system according to claim 1, wherein, when the detected temperature is set as the new temperature setting for the air conditioner, the adjusted air capacity is set as an air capacity setting for the air conditioner.

6. The air conditioning controlling system according to claim 1, wherein the cold aisle and the hot aisle are disposed across a rack in which the information processing apparatus is accommodated, and the cold aisle is disposed on a cooler side.

7. The air conditioning controlling system according to claim 2, wherein the control apparatus adjusts the air capacity based on the air pressure difference.

8. The air conditioning controlling system according to claim 2, wherein the control apparatus decreases the air capacity when the air pressure difference exceeds a threshold value, and increases the air capacity when the air pressure difference is equal to or smaller than the threshold value and exhibits a negative value.

9. The air conditioning controlling system according to claim 2, wherein, within the given range, the air pressure difference is equal to or smaller than a threshold value and exhibits a positive value.

10. The air conditioning controlling system according to claim 1, wherein the cold point in the cold aisle, the hot point in the hot aisle and the outside point are placed at the same height.

11. The air conditioning controlling system according to claim 1, wherein the cold point and the hot point are provided in such a manner that a server rack is provided between the cold point ant the hot point.

12. An air conditioning controlling method, comprising:
measuring, by a first sensor having a shape of a tube and provided in a cold aisle in a first space of a container cooled by an air conditioner and a second sensor having the shape of the tube and provided in a hot aisle in a second space of the container cooled by the air conditioner, a first air pressure difference and a second air pressure difference, respectively, the first air pressure difference being an air pressure difference between a cold point in the cold aisle and an outside point outside the first space and the second space, the second air pressure difference being an air pressure difference between a hot point in the hot aisle and the outside point;
adjusting an air capacity of the air conditioner in such a manner that an air pressure difference between the first air pressure difference and the second air pressure difference falls within a given range when a temperature in the container becomes a temperature setting for the air conditioner;
calculating a first prediction value of a power consumption amount of the information processing apparatus and a second prediction value of a power consumption amount of the air conditioner at the adjusted air capacity of the air conditioner based on a temperature of air outside the first space and the second space;
selecting a temperature at which a total value of the first prediction value and the second prediction value is minimized from a storage including a plurality of temperatures to be set in the air conditioner in association with respective total values; and
setting the selected temperature as a new temperature setting for the air conditioner.

13. The air conditioning controlling method according to claim 12, further comprising, storing the total value in the storage when the selected temperature is set as the temperature setting for the air conditioner.

14. The air conditioning controlling method according to claim 12, further comprising,
measuring the temperature of air outside the first space and the second space.

15. The air conditioning controlling method according to claim 12, further comprising,
setting the adjusted air capacity as an air capacity setting for the air conditioner when the selected temperature is set as the temperature setting for the air conditioner.

16. The air conditioning controlling method according to claim 12, wherein the cold aisle is disposed on a cooler side.

17. The air conditioning controlling method according to claim 12, further comprising:
decreasing the air capacity when the air pressure difference between the first air pressure difference and the second air pressure difference exceeds a threshold value; and
increasing the air capacity when the air pressure difference between the first air pressure difference and the second air pressure difference is equal to or smaller than the threshold value and exhibits a negative value.

18. The air conditioning controlling method according to claim 12, wherein the first sensor has a shape of a tube which is coupled to the cold point and the outside point and the second sensor has a shape of a tube which is coupled to the hot point and the outside point.

19. The air conditioning controlling method according to claim 12, wherein the cold point in the cold aisle, the hot point in the hot aisle and the outside point are placed at the same height.

20. The air conditioning controlling method according to claim 12, wherein the cold point and the hot point are provided in such a manner that a server rack is provided between the cold point ant the hot point.

* * * * *